United States Patent
Teoh et al.

(10) Patent No.: US 10,139,445 B2
(45) Date of Patent: Nov. 27, 2018

(54) HIGH SPEED I/O PINLESS STRUCTURAL TESTING

(71) Applicant: Intel Corporation, Santa Clara, CA (US)

(72) Inventors: Chin Keat Teoh, Georgetown (MY); Satheesh Chellappan, Folsom, CA (US); Lay Cheng Ong, Georgetown (MY); Terrence Huat Hin Tan, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 15/282,030

(22) Filed: Sep. 30, 2016

(65) Prior Publication Data

US 2018/0096736 A1    Apr. 5, 2018

(51) Int. Cl.
*G01R 31/28* (2006.01)
*G11C 29/56* (2006.01)
*G06F 9/4401* (2018.01)
*G06F 11/273* (2006.01)

(52) U.S. Cl.
CPC ..... *G01R 31/2884* (2013.01); *G01R 31/2853* (2013.01); *G06F 9/4403* (2013.01); *G06F 11/2736* (2013.01); *G11C 29/56004* (2013.01); *G06F 2217/14* (2013.01); *G11C 2029/5602* (2013.01)

(58) Field of Classification Search
CPC ............. G11C 29/50; G11C 29/56004; G11C 29/56008; G11C 29/5602; G11C 2029/5602; G01R 31/2853; G01R 31/2884; G01R 31/2894; G06F 11/2736; G06F 2217/14
See application file for complete search history.

(56) References Cited

U.S. PATENT DOCUMENTS

| 6,678,850 B2 * | 1/2004 | Roy ................. G01R 31/31905 714/719 |
| 9,141,496 B2 * | 9/2015 | Radulescu ............ G06F 11/221 |
| 2015/0089289 A1 * | 3/2015 | Gahoi ..................... G06F 11/27 714/30 |

* cited by examiner

*Primary Examiner* — Shelly A Chase
(74) *Attorney, Agent, or Firm* — Schwegman Lunberg & Woessner, P.A.

(57) ABSTRACT

A technical solution for improving test times and costs associated with IC production includes a central test engine (CTE) functional test block integrated onto an IC. The CTE functions as a hardware abstraction layer (HAL), and provides testing capabilities by transferring a large test data file to a device under test and performing a closed-loop monitoring of receipt of the expected test data results. The CTE also reduces the number of external interfaces and interface controllers used during testing. The reduction in external interfaces reduces the size of the IC, which enables smaller and more efficient IC manufacturing, and may be used to improve small form-factor high-volume manufacturing (HVM). This reduction in IO pins also enables significant reduction in IO resources (e.g., IO drivers) within the IC, and reduces or eliminates IO test hardware dependencies.

20 Claims, 7 Drawing Sheets

US 10,139,445 B2

HIGH SPEED I/O PINLESS STRUCTURAL TESTING

TECHNICAL FIELD

Embodiments described herein generally relate to testing of integrated circuits (ICs).

BACKGROUND

Production of ICs, such as silicon-based ICs, includes fabrication and testing of the IC. The hardware used to test these ICs is dependent on the inputs and outputs (IOs) available on the IC. The hardware required for testing typically depends on the number, availability, and data transfer rate of the IOs. For example, high-volume manufacturing (HVM) requires several IO pins to perform HVM testing. As the processing speed of ICs increases, and as the data transfer rate of IOs increases, the testing phase of IC production requires an increasing test cost due to increasing the number and duration of post-fabrication tests. It is desirable to reduce the time and cost required for testing ICs during production.

DESCRIPTION OF EMBODIMENTS

A technical solution for improving test times and costs associated with IC production includes a new functional test block integrated onto the IC. This new design for test (DFT) functional block (e.g., design for manufacturability (DFM) block, design for assembly (DFA) block), is referred to as a central test engine (CTE). The CTE 310 functions as a hardware abstraction layer (HAL), and provides testing capabilities by transferring a large test data file to a device under test and performing a closed-loop monitoring of receipt of the expected test data results. This CTE may be used in various types of ICs, including a system on a chip (SoC), a system in a package (SIP), a chipset, or another type of IC. In contrast to an external test access mechanism (TAM) conveying test data, the CTE generates test patterns that do not require a TAM network, enabling the CTE system to be autonomous. The CTE uses a test interface pin for configuring the CTE. Example interface pins may include a general-purpose input and output (GPIO) pins, Joint Test Action Group (JTAG) pins, or other types of interface pins. However, because the CTE handles testing within the IC, the CTE does not require external testing hardware dependencies required by many ICs, which eliminates some or all of the number of testing interface pins required by many ICs.

The testing improvements provided by CTE reduces the time and cost of IC testing, which reduces the overall time and costs for IC manufacturing. The reduction in test time may be used to improve the efficiency of testing increasingly high speed IOs. The CTE reduces or eliminates the need for a pre-silicon preparation phase. The CTE also reduces the number of external interfaces and interface controllers used during testing. In an example, the CTE reduces or eliminates the number of required GPIO pins, and enables pure JTAG testing. The reduction in external interfaces reduces the size of the IC, which enables smaller and more efficient IC manufacturing, and may be used to improve small form-factor high-volume manufacturing (HVM). This reduction in IO pins also enables significant reduction in IO resources (e.g., IO drivers) within the IC, and reduces or eliminates IO test hardware dependencies.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
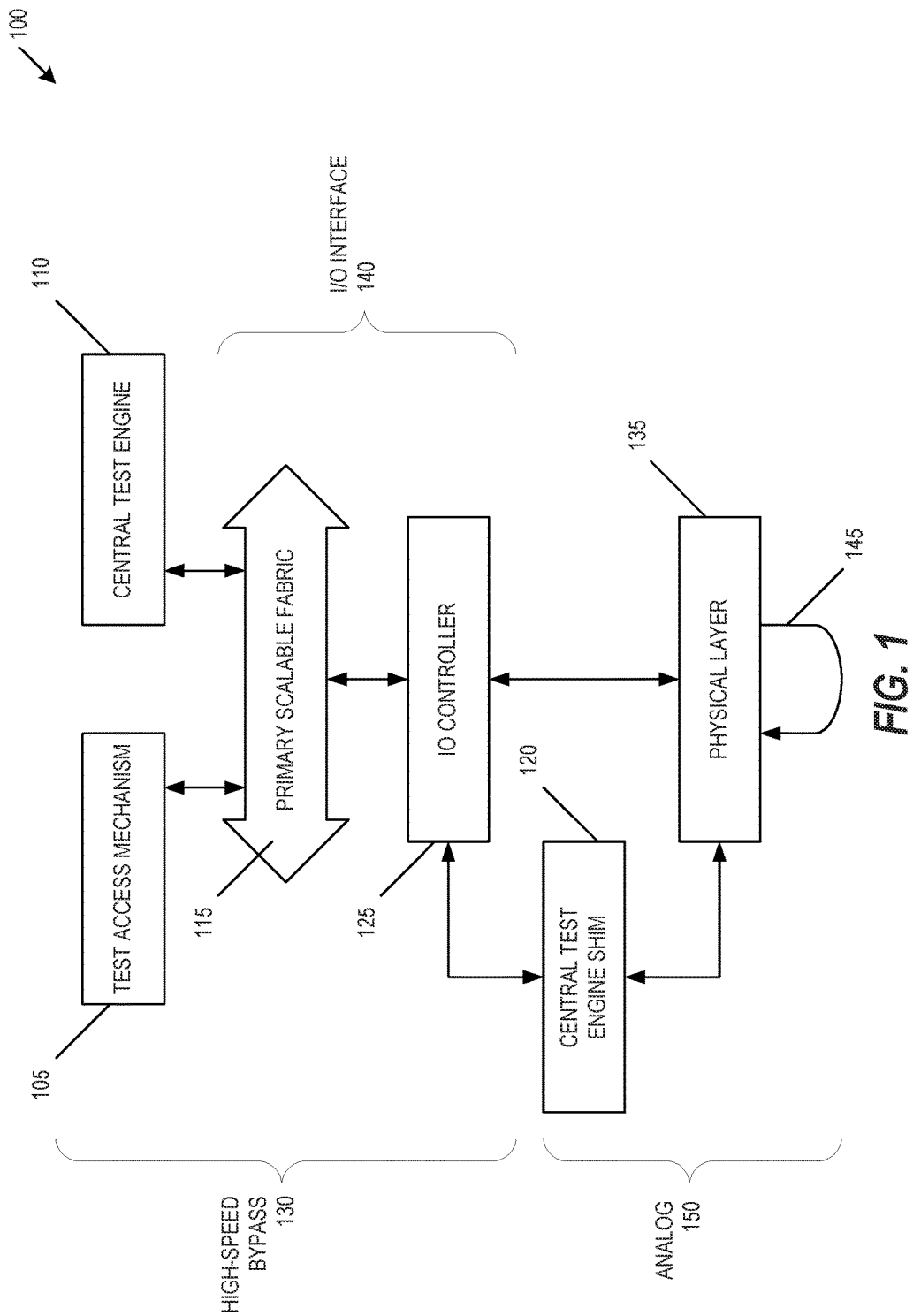
FIG. 1 is a first block diagram of a Central Test Engine (CTE) system, in accordance with at least one embodiment of the invention.

FIG. 1 is a first block diagram of a CTE system 100, in accordance with at least one embodiment of the invention. System 100 may be integrated within a SoC, SIP, a chipset, or another type of IC. System 100 includes a test access mechanism (TAM) 105 connected to an on-chip communication device. The on-chip communication device may include primary scalable fabric (PSF) 115, an on-chip system fabric (OSF), a communication bus, or another on-chip communication device. The TAM 105 provides controller testing and exercise data to the PSF 115, such as providing test data to PSF 115. System 100 includes a CTE 110 DFT block, where the CTE 110 is also connected to the PSF 115. The PSF 115 is connected to IO controller 125. The TAM 105 or the CTE 110 may include a test controller, and may use a test access port (TAP) to control the IO controller 125 during testing operations. The IO controller 125 is connected to a physical layer 135 (e.g., PHY layer), where the physical layer 135 is used to transmit data over a physical medium from the IO controller 125 or to receive data from the IO controller 125. The combination of the PSF 115 and IO controller 125 function as the IO interface 140 between the TAM 105, CTE 110, and the physical layer 135. The CTE 110 handles the data structure upstream from the IO controller 125, and generates downstream traffic from the IO controller 125 to the physical layer 135.

The combination of the TAM 105, PSF 115, and IO controller 125 (excluding the CTE 110) function as a High-speed ByPass (HBP) group 130, which may be used to perform HBP testing of the physical layer 135 (e.g., the analog portion 150). This HBP testing may provide controller testing. However, HBP testing has limitations, including limited testing capability for Link Training and Status State Machine (LTSSM) testing, and limited testing capability for physical layer 135 testing. For example, the HBP testing provides partial testing of the physical layer 135, but is unable to test the power state of the physical layer 135, is unable to isolate the controller during testing, and is unable to provide protocol testing. These limitations affect the ability of HBP testing to provide full test coverage for USB3 devices and USB3 hosts, whose testing requires three different test types with multiple test patterns in each test type to provide full testing coverage of the USB3 controller and physical layer 135. HBP testing is further limited by requiring a long silicon bring-up time, having a determinism issue due to HBP testing sensitivity, and requiring tester hardware to drive multiple TAM and HBP testing pins.

As an alternative to HBP testing, the CTE 110 may be used to test the physical layer 135. In an embodiment, the CTE 110 generates test patterns independent of TAM network, making the testing fully autonomous. The CTE 110 may be used to test IO controller 125 and physical layer 135. The CTE 110 communicates with a CTE shim 120. The CTE shim 120 is specific to the IO controller 125, where the CTE shim 120 provides configuration and initialization for the IO controller 125 and for the physical layer 135. The CTE shim 120 may configure or initialize the IO controller 125 and physical layer 135 directly, or may provide a backdoor access (e.g., override access) to configure or initialize the IO controller 125 and physical layer 135. A loopback connection 145 may be used to redirect test data back into the physical layer 135. Using a USB3 example, instead of sending USB3 data from the physical layer 135 to an external USB3 testing device, the USB3 data is redirected using the loopback connection 145 into the physical layer 135. The test data redirected into the physical layer 135 may be provided to the CTE 110 for test data verification. The loopback connection 145 may include a conductive trace within the physical layer 135 or may include a conductive trace loop external to the physical layer 135. The CTE 110 may be used to test multiple IO controllers 125 and physical layers 135, such as shown in FIG. 2.

Figure 2:
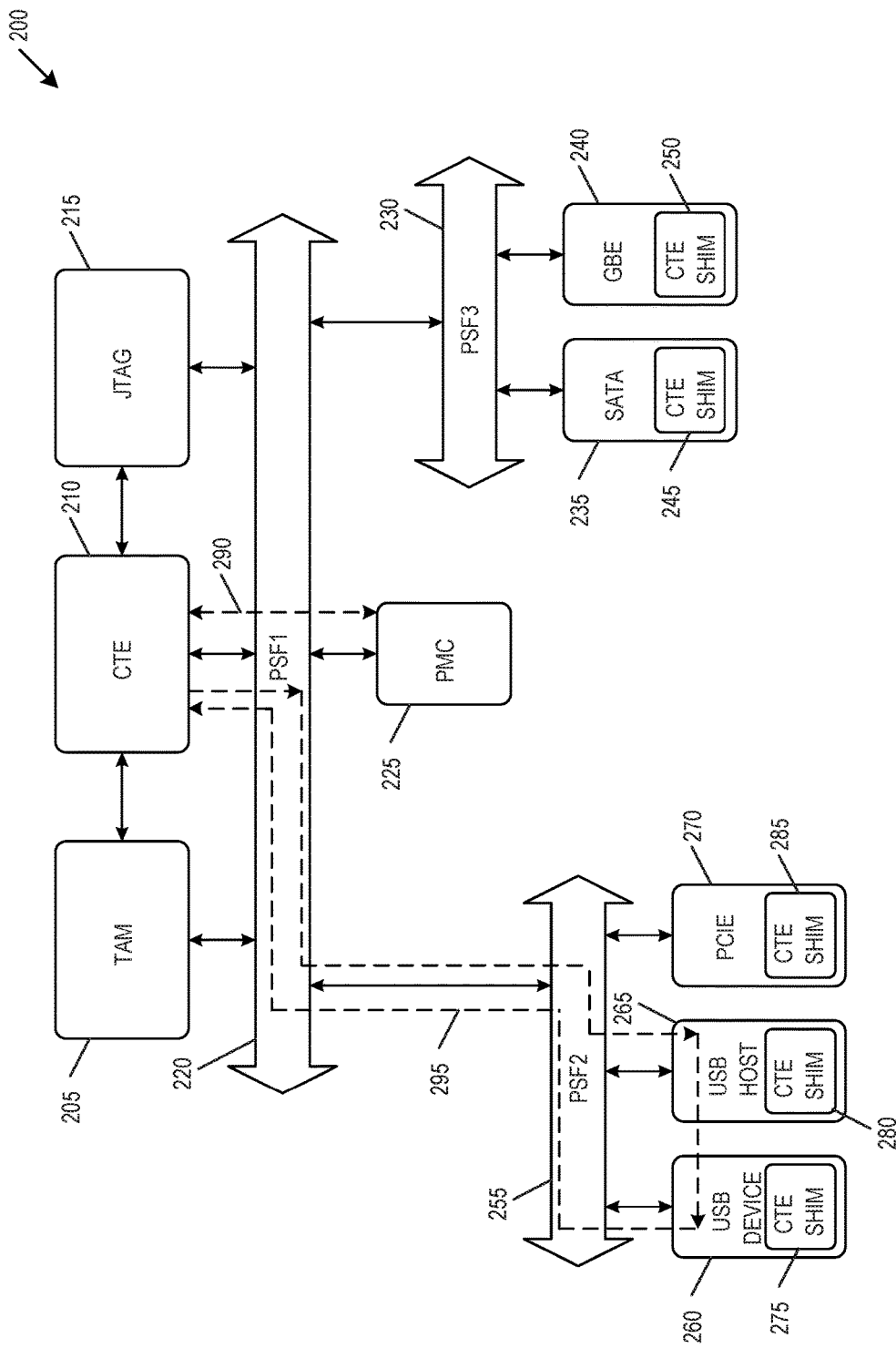
FIG. 2 is a second block diagram of a CTE system, in accordance with at least one embodiment of the invention.

FIG. 2 is a second block diagram of a CTE system 200, in accordance with at least one embodiment of the invention. System 200 includes a CTE 210, which is connected to TAM 205, which are both connected to a first primary scalable fabric PSF1 220. The CTE 210 is connected to a JTAG interface 215. The CTE 210 may receive all needed external commands from the JTAG interface 215, which reduces or eliminates the need for GPIO pins. The CTE 210 communicates with the TAM 205 or JTAG interface 215 to initialize each test sequence, either directly between blocks or through PSF1 220. In an example, the CTE 210 initializes each test using a test register, such as a DFT register. System 200 includes a power management controller (PMC) 225, which may be controlled by the CTE 210 through a power interface 290. The CTE 210 may control the PMC 225 to execute a power cycle, a low-power mode, a boot power sequence, or other power mode.

The CTE 210 may function as a common test driver for multiple device circuits implemented within the system 200. Device circuits may include a USB device 260, a USB host 265, a peripheral component interconnect express (PCIe) device 270, a serial AT attachment (SATA) device 235, a gigabit Ethernet (GbE) device 240, or other device types. Each device includes an IO controller, a physical layer, and associated CTE shim, such as USB device CTE shim 275, USB host CTE shim 280, PCIe CTE shim 285, SATA CTE shim 245, or GbE CTE shim 250. The CTE shims may be used to allow the CTE system 200 to boot in isolation, where each device is able to complete a boot sequence using the components within CTE system 200. The CTE shims may also be used to provide backdoor or override access to device configuration and initialization. For example, the CTE shims may provide an override for functional test block power, clock enablement for the device under test, bypass override, or other controls. The CTE shims may also handle power sequences for the PMC 225, such as a save-and-restore sequence used during a low-power transition. The CTE 210 may execute test procedures through PSF1 220, through second primary scalable fabric PSF2 255, and through third primary scalable fabric PSF3 230. For example, the CTE 210 may follow communication path 295 through PSF1 290 and PSF2 255 to USB host 265, use data from the USB host 265 to test USB device 260, and return test results to the CTE 210.

Figure 3:
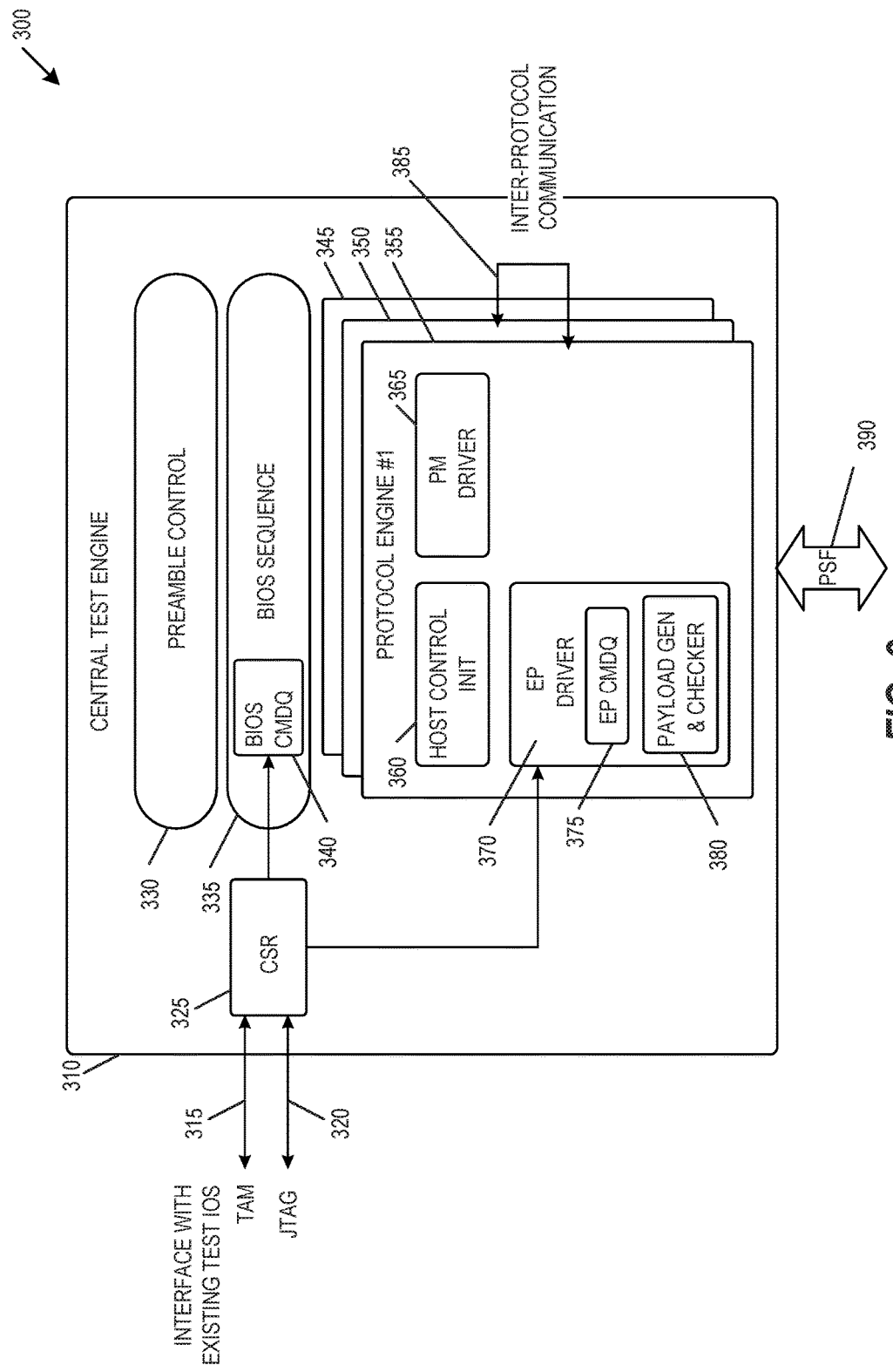
FIG. 3 is a block diagram of a CTE system, in accordance with at least one embodiment of the invention.

FIG. 3 is a block diagram of a CTE system 300, in accordance with at least one embodiment of the invention. System 300 includes a CTE 310 that is connected to one or more test IOs, such as a TAM interface 315 or JTAG interface 320. The TAM interface 315 or JTAG interface 320 may provide control parameters or other test parameters to a control and status register (CSR) 325. The CSR 325 may be configured to enable IOs, to select device under test lane numbers, to select device under test port numbers, or to configure other test parameters. The CSR 325 also enables the test sequence to program one or more CMDQs (Command Queues), such as the basic input/output system (BIOS) CMDQ 340 or the endpoint (EP) driver CMDQ 375.

System 300 includes a preamble control 330. The preamble control 330 includes various testing overrides, such as power overrides to enable power sequences and reset sequences to the device under test. The preamble control 330 is used to bypass the normal boot flow (e.g., booting from an external source). This enables testing of the production BIOS sequence during structural testing without requiring an externally provided BIOS sequence. This preamble control 330 sequences the device under test to enable various testing modes where the power or reset commands are overridden.

System 300 includes a BIOS sequence 335. The BIOS sequence 335 executes the BIOS sequence of device under test. The test setup will select the BIOS boot sequence of the device under test and program the BIOS CMDQ 340, such as by programming a FIFO register within the BIOS CMDQ 340 using configuration data within CSR 325 access registers. Once testing is enabled and the BIOS CMDQ 340 has been programmed, the BIOS CMDQ 340 provides the programming sequence through Primary Scalable Fabric (PSF) 390. For concurrent testing of multiple IOs, multiple BIOS CMDQs 340 may be allocated and sequenced.

System 300 includes one or more protocol engines (PEs) 345, 350, 355. Each PE, such as PE1 355, is unique to an IO (e.g., unique to a device under test). By using multiple PEs within the CTE 310, the system 300 provides the ability to cater to different protocols without requiring external inputs. Multiple PEs also provide the ability to run tests in parallel, in sequence, or in a combination of parallel and sequential testing. PE1 355 includes sub-block structures similar to other PEs, but to support different protocols, the microarchitecture within each sub-block may be specific to each protocol. The multiple PEs may also be used across different protocols. PE1 355 provides protocol-specific testing by generating the large test data file, and subsequently verifying the expected test data results. PE1 355 may include a host controller initialization (HCI) block 360, a power management (PM) driver 370, and an EP driver 370. The HCI 360 handles sequences of the global initialization of the device under test, such as configuring the number of ports, configuring endpoints, configuring interrupts, or configuring feature enable flags. The PM driver 370 handles the low power (LP) state entry of Link Training and Status State Machine (LTSSM) testing, such as testing using the LTSSM-specific LP states U0 -U3. The PM driver 370 also controls the PMC sequence during platform low power entry and exit. The PMC sequence may be used in a power management driver 365 within the PE1 355, or may be used to control PMC 225 shown in FIG. 2. The EP driver 370 is specific to an IO protocol, such as operating similar to a USB driver by managing USB control, USB bulk-in, and USB bulk-out. The EP driver 370 is instantiated according to the number of EPs in the protocol port connection. In various embodiments, various EP drivers 370 may instantiate 2 EPs (e.g., 1 control EP and 1 bulk EP), or up to 32 EPs. The EP drivers 370 convey data, such as by managing data through various FIFO registers or other registers. The EP driver 370 handles the transfer ring buffer (TRB) setup, payload, and event handlers. The EP drivers 370 also enumerates the device under test and triggers the device testing data packets, such as enumerating a USB device and triggering USB test data packets. The EP drivers 370 support all test data packet types to provide full test coverage. The EP drivers 370 may program the EP CMDQ 375, where the EP CMDQ 375 may sequence the type of test data packets or provide a PMC sequence to be handled autonomously by EP driver 370. The payload generator and checker 380 replicates the system memory storage for each test data payload. The payload generator and checker 380 also acts as a cross-check for communication between PEs, such as using inter-protocol communication 385. Multiple EP drivers 370 may be used for different tests, and may include different payloads.

Figure 4:
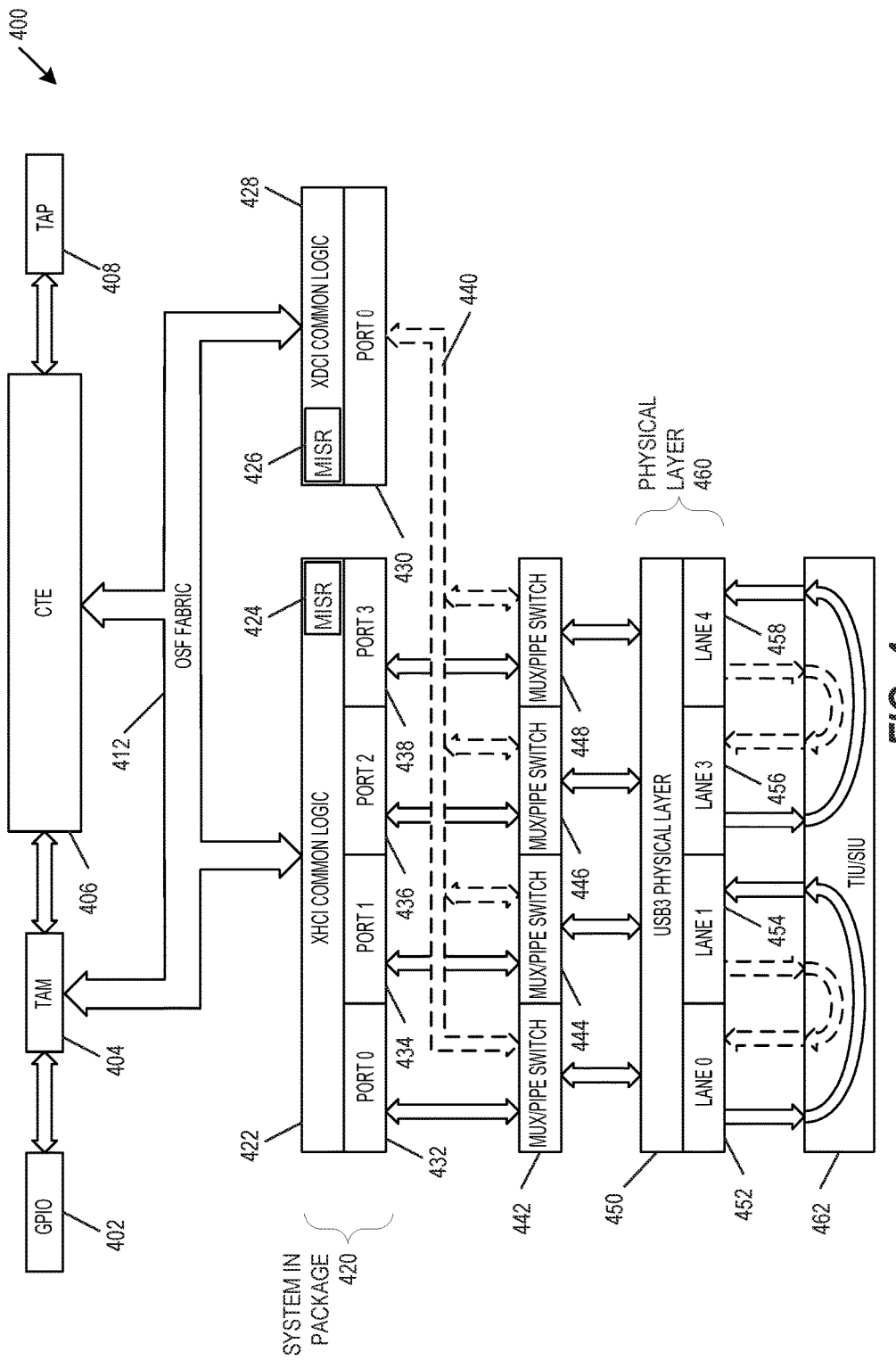
FIG. 4 is a block diagram of a CTE usage model, in accordance with at least one embodiment of the invention.

FIG. 4 is a block diagram of a CTE usage model 400, in accordance with at least one embodiment of the invention. Usage model 400 includes an example configuration for testing an IO device, such as a USB3 IO device. Usage model 400 includes a CTE 406, where CTE 406 generates a test data payload and verifies a result data set. In this USB3 example, CTE 406 performs USB3 IO testing through on-chip system fabric (OSF) 412 to SIP 420, where SIP 420 includes an extensible host controller interface (XHCI) common logic block 422 (e.g., the USB host) and an extensible device controller interface (XDCI) common logic block 428 (e.g., the USB device). The CTE 406 manages testing of the XHCI block 422 and the XDCI block 428. The CTE 406 may receive testing commands or testing parameters through a GPIO 402 and TAM 404 or through a test access point (TAP) 408.

When the CTE 406 receives test instructions from the TAM 404 or the TAP 408, the CTE 406 commands the XHCI block 422 and the XDCI block 428 to begin an initialization sequence. This may provide testing of various low power (LP) states, such as testing LTSSM by sending power instructions through the OSF 412 to both the XHCI block 422 and the XDCI block 428. Each of the XHCI block 422 and the XDCI block 428 may include multiple signature input registers (MISR), such as XHCI MISR 424 and XDCI MISR 426. Each of the XHCI block 422 and the XDCI block 428 may also include a single port or multiple ports. In an example, the XHCI block 422 may include multiple ports 432, 434, 436, and 438, where each port is connected to respective multiplexer (MUX/PIPE) switches 442, 444, 446, or 448. Similarly, the XDCI block 428 may include multiple ports or a single port 430, where port 430 is connected via a multiplexer 440 to one or more MUX/PIPE switches 442, 444, 446, or 448.

The MUX/PIPE switches 442, 444, 446, or 448 are connected to the physical layer 460 (e.g., PHY layer, Mod-PHY layer), where the physical layer 460 includes a USB3 physical layer 450 and one or more lanes 452, 454, 456, or 458. Each of the lanes 452, 454, 456, or 458 are connected to a tester interface unit or system interface unit (TIU/SIU) 462, which may provide a data loopback between pairs of lanes. In operation, the CTE 406 commands SIP 420 to execute a test mode, and the CTE 406 may generate data needed into both the XHCI block 422 and the XDCI block 428. Data is sent from the SIP 420 to the physical layer 460, where one or more TIU/SIU 462 loopback paths direct test result data back through the physical layer 460 and the SIP 420 to the CTE 406. CTE 406 may also verify the received test result data, and may provide a pass or fail condition.

CTE usage model 400 provides various advantages. The CTE 406 provides test capability between multiple IO sub-blocks, such as between a USB3 host and a USB3 device. The CTE 406 provides on-chip testing (e.g., native test coverage) on an IC, which reduces or eliminates external tester hardware requirements. The CTE 406 provides the ability to test IO controllers, to test the physical layer, and to test multiple different protocols. The CTE 406 also manages a BIOS boot sequence for the physical layer 460, which enables the loopback test through physical layer 460. Because the CTE 406 handles this BIOS configuration, the CTE 406 reduces or eliminates failures on the physical layer 460 that are often experienced during high-volume manufacturing (HVM), which significantly improves manufacturing time.

Figure 5:
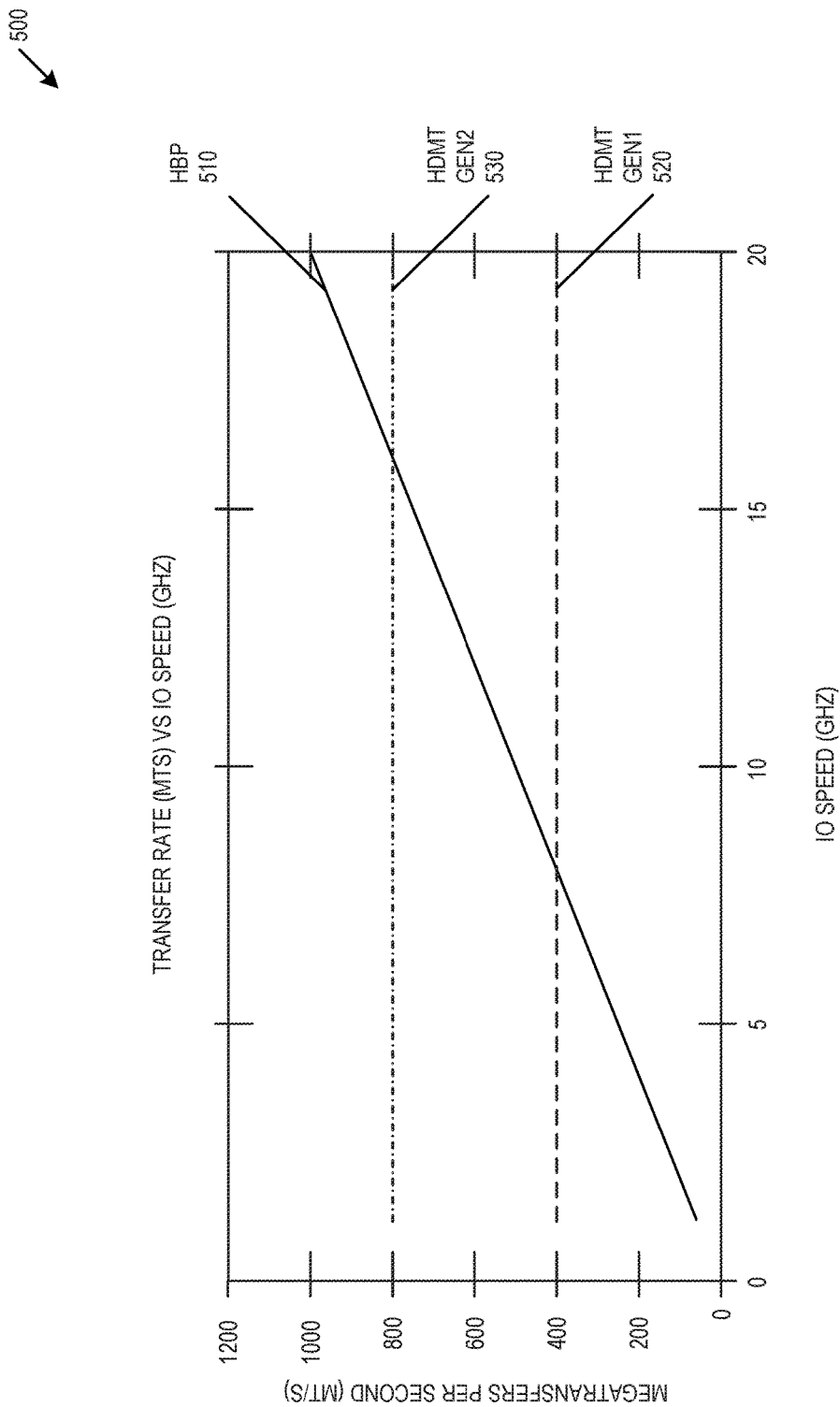
FIG. 5 is a graph of a high-speed bypass (HBP) tester comparison, in accordance with at least one embodiment of the invention.

FIG. 5 is a graph of a high-speed bypass (HBP) test comparison 500, in accordance with at least one embodiment of the invention. Tester comparison 500 depicts the approximate relationship between the HBP test data rate (e.g., test device interface data rate) in megatransfers per second (MT/s) and the IO speed (GHz). The use of a HBP test 510 has an approximately linear relationship between the IO speed and the MT/s. The first generation High Density Modular Test (HDMT) 520 provides a transfer rate of approximately 400 MT/s. In contrast, the second generation HDMT 530 provides a transfer rate of approximately 800 MT/s. The use of a CTE enables remaining with first generation HDMT 520, which uses the lower value of 400 MT/s. The use of a CTE provides additional advantages, as shown in FIG. 6.

Figure 6:
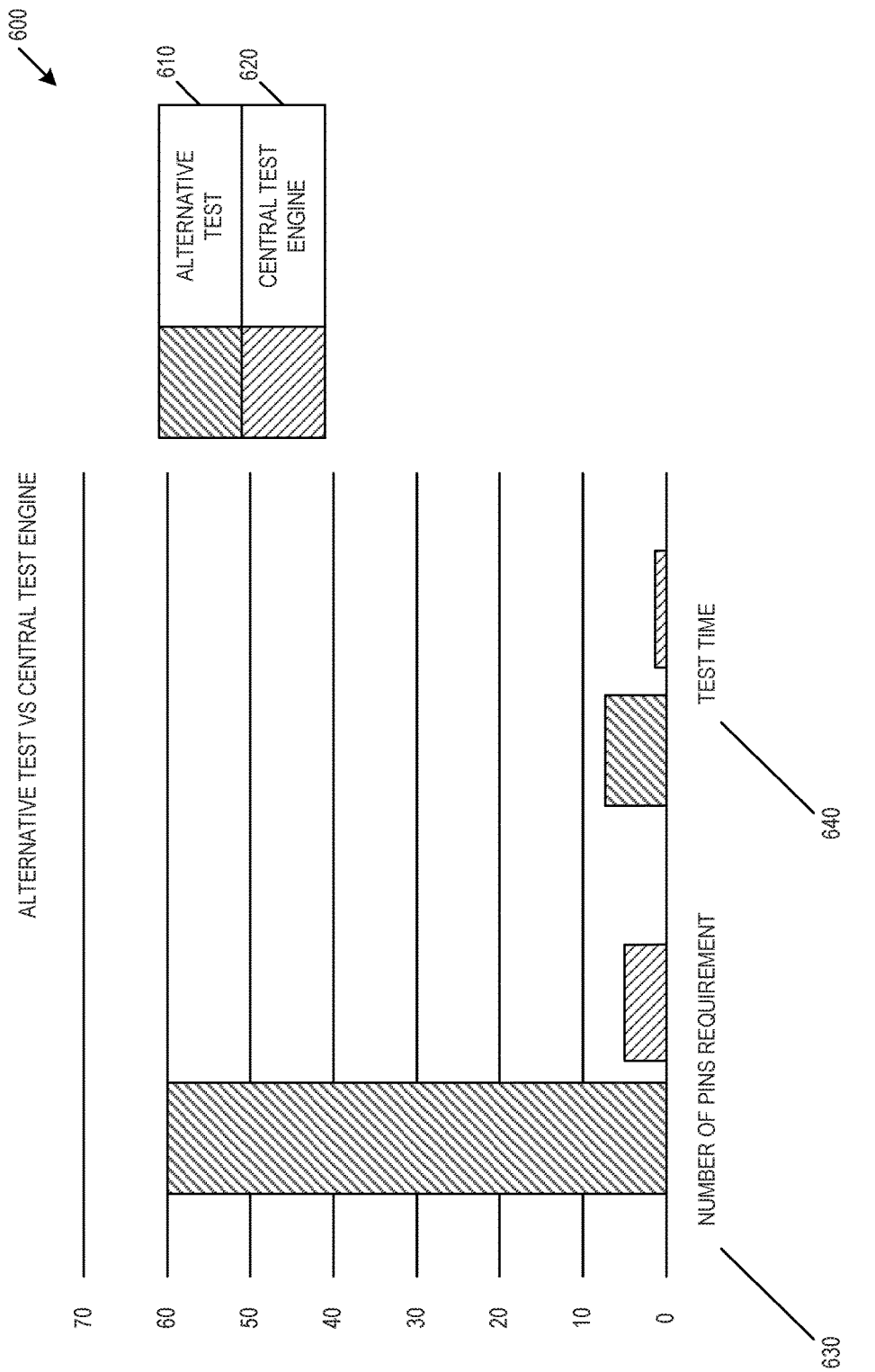
FIG. 6 is a graph of a CTE comparison, in accordance with at least one embodiment of the invention.

FIG. 6 is a graph of a CTE comparison 600, in accordance with at least one embodiment of the invention. Comparison 600 shows approximate comparisons between an alternative test 610 (e.g., HBP test) and the CTE 620. Comparison 600 shows that the number of pins required 630 may be reduced from approximately 60 pins to approximately 5 pins. Comparison 600 also shows a significant reduction in test time 640. This comparison can be seen in CTE Comparison Table 1 below:

TABLE 1

CTE Comparison

| Factors | Alternative Test | CTE Testing |
| --- | --- | --- |
| Test Hardware ($) | 2$^{nd}$ Generation High Density Modular Test (GEN2 HDMT) | Can remain with GEN1 HDMT |
| Pins Required | 60 or more (JTAG and TAM or STF and HBP) | 5 (JTAG) |
| Test Time (seconds) | 7 s (TAM or HBP and Interface and Analog) | 1.2 s (CTE) |
| Product Platform Validation | Required | Potential to Eliminated |

As shown in CTE Comparison Table 1 above, the CTE testing enables using first generation HDMT 520, which enables a low number of tests for 8 or more IOs, as shown in FIG. 5. Table 1 shows that CTE testing reduces the pins required to 5 JTAG pins and reduces the test time to 1.2 seconds, which is shown in FIG. 6 as the number of pins 630 and the test time 640. Also as shown in Table 1, the CTE testing may reduce or eliminate product platform validation (PPV) by reducing the additional structural and functional testing that needs to be conducted using alternative automated production testers.

CTE comparison 600 also shows an estimated test cost comparison 650. Additional details about estimated cost reduction are shown in Table 2, below:

TABLE 2

CTE Cost Savings for USB3 Testing

| Si | Interface | Time per Seq. (ms) | Seq./Port | Total Test Time (ms) | CTE Test (ms) |
|---|---|---|---|---|---|
| Sort | Host HBP | 72 | 11 | 2376 (3 ports) | 600 (3 ports) |
| | Device HBP | 65 | 4 | 260 (1 port) | |
| | Host Interface | 200 | 1 | 600 (3 ports) | |
| | Device Interface | 240 | 1 | 240 (1 port) | |
| Class | Host HBP | 72 | 11 | 2376 (3 ports) | 600 (3 ports) |
| | Device HBP | 65 | 4 | 260 (1 port) | |
| | Host Interface | 200 | 1 | 600 (3 ports) | |
| | Device Interface | 240 | 1 | 240 (1 port) | |
| Total | | | | 6952 | 1200 |

As shown in CTE Cost Savings Table 2 above, the CTE testing reduces the total time required for testing all Host and Device HBP and Interface testing from 6,952 ms to 1200 ms. The CTE testing therefore offers an improved testing methodology that will result in more effective and efficient IC testing.

Figure 7:
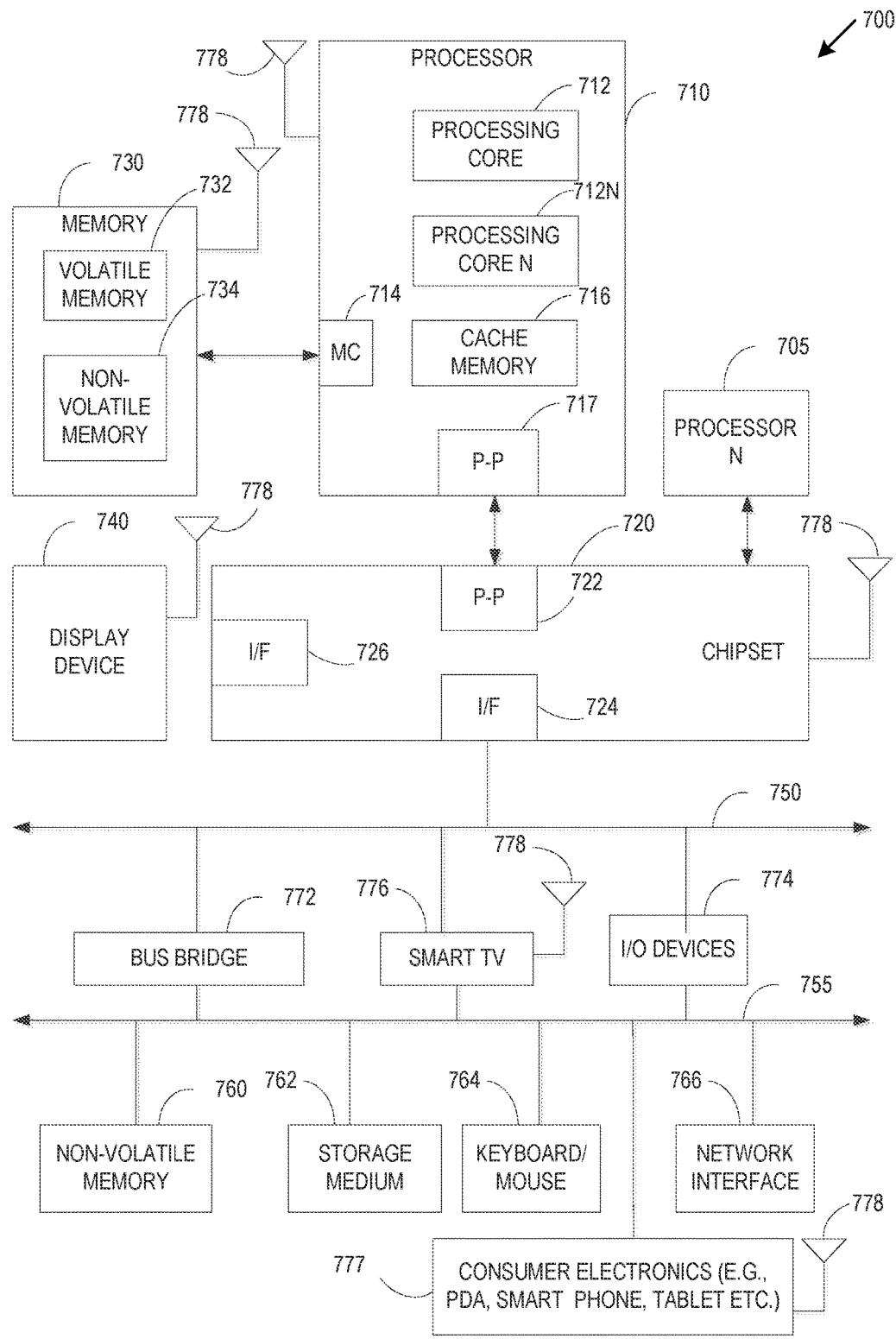
FIG. 7 is a block diagram of an electronic device that may use a circuit interconnect apparatus or method in accordance with at least one embodiment of the invention.

FIG. 7 illustrates a system level diagram, in accordance with at least one embodiment of the invention. For instance, FIG. 7 depicts an example of an electronic device (e.g., system) including a CTE apparatus or method as described in the present disclosure. FIG. 7 is included to show an example of a higher-level device application. In one embodiment, the system includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions, and the like. In some embodiments, processor 710 has a cache memory 716 to cache instructions and/or data for system 700. Cache memory 716 may be organized into a hierarchal structure including one or more levels of cache memory 716.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 732 includes, but is not limited to, synchronous dynamic random access memory (SDRAM), dynamic random access memory (DRAM), RAMBUS dynamic random access memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP, P-P, P2P) interfaces 717 and 722. Chipset 720 enables processor 710 to connect to other elements in system 700. In some embodiments, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705, display device 740, and other devices 772, 776, 774, 760, 762, 764, 766, 777, and so forth. Chipset 720 may also be coupled to a wireless antenna 778 to communicate with any device configured to transmit and/or receive wireless signals.

Chipset 720 connects to display device 740 via interface 726. Display device 740 may be, for example, a liquid crystal display (LCD), a plasma display, cathode ray tube (CRT) display, or any other form of visual display device. In some embodiments, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, mass storage device(s) 762, keyboard/mouse 764, and network interface 766 via interface 724 and/or 704, smart TV 776, consumer electronics 777, and so forth.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a peripheral component interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the method and apparatuses disclosed herein, a non-limiting list of embodiments is provided here:

Example 1 is a system comprising: an integrated circuit disposed on a substrate; a physical layer interface to convey physical medium data between the integrated circuit and a physical medium, the physical layer interface disposed on the substrate; a central test engine to test the integrated circuit, the central test engine disposed on the substrate; and a central test engine shim to control the integrated circuit based on test control data received from the central test engine, the central test engine shim disposed on the substrate.

In Example 2, the subject matter of Example 1 optionally includes a control and status register to receive a register programming input from an external interface.

In Example 3, the subject matter of Example 2 optionally includes a BIOS block to provide a BIOS boot sequence to the integrated circuit.

In Example 4, the subject matter of Example 3 optionally includes the BIOS block including a BIOS command queue register to receive the BIOS boot sequence from the control and status register.

In Example 5, the subject matter of any one or more of Examples 2-4 optionally include a protocol engine to generate a protocol-specific test data file, the test data file used by the central test engine to test the integrated circuit.

In Example 6, the subject matter of Example 5 optionally includes wherein the protocol engine further verifies a test result data file.

In Example 7, the subject matter of any one or more of Examples 5-6 optionally include wherein the protocol engine further includes a host controller initialization to apply a global initialization sequence to the integrated circuit during testing.

In Example 8, the subject matter of any one or more of Examples 5-7 optionally include wherein the protocol engine further includes a power management driver to provide a low power sequence to the integrated circuit during testing.

In Example 9, the subject matter of any one or more of Examples 5-8 optionally include wherein the protocol engine further includes an end-point driver to control the integrated circuit during testing.

In Example 10, the subject matter of any one or more of Examples 6-9 optionally include wherein the protocol engine further includes a payload generator and checker to generate a system memory storage replica that corresponds to the test data file.

In Example 11, the subject matter of Example 10 optionally includes wherein the payload generator and checker is further to verify the test result data file.

In Example 12, the subject matter of any one or more of Examples 1-11 optionally include a preamble control to bypass a boot sequence for the integrated circuit.

In Example 13, the subject matter of any one or more of Examples 1-12 optionally include an interconnect fabric to convey test control data between the central test engine and the integrated circuit.

In Example 14, the subject matter of any one or more of Examples 1-13 optionally include a loopback to convey physical medium data within the physical layer.

In Example 15, the subject matter of Example 14 optionally includes wherein the loopback is integrated within the physical layer interface.

In Example 16, the subject matter of any one or more of Examples 14-15 optionally include wherein the loopback includes a conductor loop disposed external to the physical layer interface.

In Example 17, the subject matter of any one or more of Examples 1-16 optionally include a power management circuit to control power to the integrated circuit, wherein the test control data instructs the central test engine shim to control a power source applied to the integrated circuit.

In Example 18, the subject matter of Example 17 optionally includes wherein the test control data instructs the central test engine shim to control a power source according to a power management sequence.

In Example 19, the subject matter of any one or more of Examples 1-18 optionally include wherein the test control data instructs the central test engine shim to control a clock within the integrated circuit.

Example 20 is a method of testing an integrated circuit comprising: generating a test data set and a test control data set at a central test engine, receiving the test data set and the test control data set at a central test engine shim, the central test engine shim and the central test engine disposed on a substrate; generating a physical medium data set at the physical layer based on the test data set; sending the physical medium data set from the physical layer to a loopback device; receiving a result data set from the loopback device at the central test engine; and verifying the result data set.

In Example 21, the subject matter of Example 20 optionally includes receiving a register programming input from an external interface at a control and status register, wherein generating the test control data set is based on the register programming input.

In Example 22, the subject matter of Example 21 optionally includes applying a boot sequence from a BIOS block to the physical layer.

In Example 23, the subject matter of Example 22 optionally includes receiving the BIOS boot sequence from the control and status register at a BIOS command queue register within the BIOS block.

In Example 24, the subject matter of any one or more of Examples 21-23 optionally include generating a protocol-specific test data file at a protocol engine.

In Example 25, the subject matter of Example 24 optionally includes wherein the protocol engine verifies the result data set.

In Example 26, the subject matter of any one or more of Examples 24-25 optionally include applying a global initialization sequence from a host controller initialization block to the physical layer.

In Example 27, the subject matter of any one or more of Examples 24-26 optionally include providing a low power sequence from a power management driver to the physical layer.

In Example 28, the subject matter of any one or more of Examples 24-27 optionally include controlling the physical layer through an end-point driver within the protocol engine.

In Example 29, the subject matter of any one or more of Examples 25-28 optionally include generating a system memory storage replica based on the test data file at a payload generator and checker.

In Example 30, the subject matter of Example 29 optionally includes verifying the test result data file at the payload generator and checker.

In Example 31, the subject matter of any one or more of Examples 20-30 optionally include generating a bypass boot sequence at a preamble control.

In Example 32, the subject matter of any one or more of Examples 20-31 optionally include conveying test control data between the central test engine and the integrated circuit via an interconnect fabric.

In Example 33, the subject matter of any one or more of Examples 20-32 optionally include wherein the loopback device is integrated within the physical layer interface.

In Example 34, the subject matter of any one or more of Examples 20-33 optionally include wherein the loopback device includes a conductor loop disposed external to the physical layer interface.

In Example 35, the subject matter of any one or more of Examples 20-34 optionally include applying a controlled power from a power management circuit to the physical layer.

In Example 36, the subject matter of Example 35 optionally includes instructing the central test engine shim to control a power source according to a power management sequence.

In Example 37, the subject matter of any one or more of Examples 20-36 optionally include controlling a clock based on the test control data.

Example 38 is a machine-readable medium including instructions, which when executed by a computing system, cause the computing system to perform any of the methods of Examples 20-37.

Example 39 is an apparatus comprising means for performing any of the methods of Examples 20-37.

Example 40 is at least one machine-readable storage medium, comprising a plurality of instructions that, responsive to being executed with processor circuitry of a computer-controlled device, cause the computer-controlled device to: generate a test data set and a test control data set at a central test engine, receive the test data set and the test control data set at a central test engine shim, the central test engine shim and the central test engine disposed on a substrate; generate a physical medium data set at the physical layer based on the test data set; send the physical medium data set from the physical layer to a loopback device; receive a result data set from the loopback device at the central test engine; and verify the result data set.

In Example 41, the subject matter of Example 40 optionally includes the instructions further causing the computer-controlled device to receive a register programming input from an external interface at a control and status register, wherein generating the test control data set is based on the register programming input.

In Example 42, the subject matter of Example 41 optionally includes the instructions further causing the computer-controlled device to apply a boot sequence from a BIOS block to the physical layer.

In Example 43, the subject matter of Example 42 optionally includes the instructions further causing the computer-controlled device to receive the BIOS boot sequence from the control and status register at a BIOS command queue register within the BIOS block.

In Example 44, the subject matter of any one or more of Examples 41-43 optionally include the instructions further causing the computer-controlled device to generate a protocol-specific test data file at a protocol engine.

In Example 45, the subject matter of Example 44 optionally includes the instructions further causing the computer-controlled device to cause the protocol engine to verify the result data set.

In Example 46, the subject matter of any one or more of Examples 44-45 optionally include the instructions further causing the computer-controlled device to apply a global initialization sequence from a host controller initialization block to the physical layer.

In Example 47, the subject matter of any one or more of Examples 44-46 optionally include the instructions further causing the computer-controlled device to provide a low power sequence from a power management driver to the physical layer.

In Example 48, the subject matter of any one or more of Examples 44-47 optionally include the instructions further causing the computer-controlled device to control the physical layer through an end-point driver within the protocol engine.

In Example 49, the subject matter of any one or more of Examples 45-48 optionally include the instructions further causing the computer-controlled device to generate a system memory storage replica based on the test data file at a payload generator and checker.

In Example 50, the subject matter of Example 49 optionally includes the instructions further causing the computer-controlled device to verify the test result data file at the payload generator and checker.

In Example 51, the subject matter of any one or more of Examples 40-50 optionally include the instructions further causing the computer-controlled device to generate a bypass boot sequence at a preamble control.

In Example 52, the subject matter of any one or more of Examples 40-51 optionally include the instructions further causing the computer-controlled device to convey test control data between the central test engine and the integrated circuit via an interconnect fabric.

In Example 53, the subject matter of any one or more of Examples 40-52 optionally include wherein the loopback device is integrated within the physical layer interface.

In Example 54, the subject matter of any one or more of Examples 40-53 optionally include wherein the loopback device includes a conductor loop disposed external to the physical layer interface.

In Example 55, the subject matter of any one or more of Examples 40-54 optionally include the instructions further causing the computer-controlled device to apply a controlled power from a power management circuit to the physical layer.

In Example 56, the subject matter of Example 55 optionally includes the instructions further causing the computer-controlled device to instruct the central test engine shim to control a power source according to a power management sequence.

In Example 57, the subject matter of any one or more of Examples 40-56 optionally include the instructions further causing the computer-controlled device to control a clock based on the test control data.

Example 58 is an apparatus for testing an integrated circuit, the apparatus comprising: means for generating a test data set and a test control data set at a central test engine, means for receiving the test data set and the test control data set at a central test engine shim, the central test engine shim and the central test engine disposed on a substrate; means for generating a physical medium data set at the physical layer based on the test data set; means for sending the physical medium data set from the physical layer to a loopback device; means for receiving a result data set from the loopback device at the central test engine; and means for verifying the result data set.

In Example 59, the subject matter of Example 58 optionally includes means for receiving a register programming input from an external interface at a control and status register, wherein generating the test control data set is based on the register programming input.

In Example 60, the subject matter of Example 59 optionally includes means for applying a boot sequence from a BIOS block to the physical layer.

In Example 61, the subject matter of Example 60 optionally includes means for receiving the BIOS boot sequence from the control and status register at a BIOS command queue register within the BIOS block.

In Example 62, the subject matter of any one or more of Examples 59-61 optionally include means for generating a protocol-specific test data file at a protocol engine.

In Example 63, the subject matter of Example 62 optionally includes wherein the protocol engine verifies the result data set.

In Example 64, the subject matter of any one or more of Examples 62-63 optionally include means for applying a global initialization sequence from a host controller initialization block to the physical layer.

In Example 65, the subject matter of any one or more of Examples 62-64 optionally include means for providing a low power sequence from a power management driver to the physical layer.

In Example 66, the subject matter of any one or more of Examples 62-65 optionally include means for controlling the physical layer through an end-point driver within the protocol engine.

In Example 67, the subject matter of any one or more of Examples 63-66 optionally include means for generating a system memory storage replica based on the test data file at a payload generator and checker.

In Example 68, the subject matter of Example 67 optionally includes means for verifying the test result data file at the payload generator and checker.

In Example 69, the subject matter of any one or more of Examples 58-68 optionally include means for generating a bypass boot sequence at a preamble control.

In Example 70, the subject matter of any one or more of Examples 58-69 optionally include means for conveying test control data between the central test engine and the integrated circuit via an interconnect fabric.

In Example 71, the subject matter of any one or more of Examples 58-70 optionally include wherein the loopback device is integrated within the physical layer interface.

In Example 72, the subject matter of any one or more of Examples 58-71 optionally include wherein the loopback device includes a conductor loop disposed external to the physical layer interface.

In Example 73, the subject matter of any one or more of Examples 58-72 optionally include means for applying a controlled power from a power management circuit to the physical layer.

In Example 74, the subject matter of Example 73 optionally includes means for instructing the central test engine shim to control a power source according to a power management sequence.

In Example 75, the subject matter of any one or more of Examples 58-74 optionally include means for controlling a clock based on the test control data.

These and other examples and features of the present stretchable substrates, stretchable substrate systems, and related methods will be set forth in part in the following detailed description. This overview is intended to provide non-limiting examples of the present subject matter—it is not intended to provide an exclusive or exhaustive explanation. The detailed description below is included to provide further information about the present stretchable substrates, stretchable substrate systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system comprising:
   an integrated circuit disposed on a substrate;
   a physical layer interface to convey physical medium data between the integrated circuit and a physical medium, the physical layer interface disposed on the substrate;
   a central test engine to test the integrated circuit, the central test engine disposed on the substrate; and a central test engine shim to control the integrated circuit based on test control data received from the central test engine, the central test engine shim disposed on the substrate.

2. The system of claim 1, further including a control and status register to receive a register programming input from an external interface.

3. The system of claim 2, further including a BIOS block to provide a BIOS boot sequence to the integrated circuit.

4. The system of claim 2, further including a protocol engine to generate a protocol-specific test data file, the test data file used by the central test engine to test the integrated circuit.

5. The system of claim 4, wherein the protocol engine further verifies a test result data file.

6. The system of claim 5, wherein the protocol engine further includes a payload generator and checker to generate a system memory storage replica that corresponds to the test data file.

7. The system of claim 6, wherein the payload generator and checker is further to verify the test result data file.

8. The system of claim 1, further including an interconnect fabric to convey test control data between the central test engine and the integrated circuit.

9. A method of testing an integrated circuit comprising:
receiving a register programming input from an external interface at a control and status register;
generating a test data set and a test control data set at a central test engine, wherein generating the test control data set is based on the register programming input;
receiving the test data set and the test control data set at a central test engine shim, the central test engine shim and the central test engine disposed on a substrate;
generating a physical medium data set at a physical layer based on the test data set;
sending the physical medium data set from the physical layer to a loopback device;
receiving a result data set from the loopback device at the central test engine; and
verifying the result data set.

10. The method of claim 9, further including applying a boot sequence from a BIOS block to the physical layer.

11. The method of claim 9, further including generating a protocol-specific test data file at a protocol engine.

12. The method of claim 9, further including receiving the BIOS boot sequence from the control and status register at a BIOS command queue register within the BIOS block.

13. At least one non-transitory machine-readable storage medium, comprising a plurality of instructions that, responsive to being executed with processor circuitry of a computer-controlled device, cause the computer-controlled device to:
receive a register programming input from an external interface at a control and status register;
generate a test data set and a test control data set at a central test engine, wherein generating the test control data set is based on the register programming input;
receive the test data set and the test control data set at a central test engine shim, the central test engine shim and the central test engine disposed on a substrate;
generate a physical medium data set at the physical layer based on the test data set;
send the physical medium data set from the physical layer to a loopback device;
receive a result data set from the loopback device at the central test engine; and
verify the result data set.

14. The machine-readable storage medium of claim 13, the instructions further causing the computer-controlled device to apply a boot sequence from a BIOS block to the physical layer.

15. The machine-readable storage medium of claim 13, the instructions further causing the computer-controlled device to generate a protocol-specific test data file at a protocol engine.

16. The machine-readable storage medium of claim 15, the instructions further causing the computer-controlled device to cause the protocol engine to verify the result data set.

17. The machine-readable storage medium of claim 16, the instructions further causing the computer-controlled device to generate a system memory storage replica based on the test data file at a payload generator and checker.

18. The machine-readable storage medium of claim 17, the instructions further causing the computer-controlled device to verify the test result data file at the payload generator and checker.

19. The machine-readable storage medium of claim 15, the instructions further causing the computer-controlled device to control the physical layer through an end-point driver within the protocol engine.

20. The machine-readable storage medium of claim 13, the instructions further causing the computer-controlled device to receive the BIOS boot sequence from the control and status register at a BIOS command queue register within the BIOS block.

* * * * *